US006292033B1

United States Patent
Enriquez

(10) Patent No.: US 6,292,033 B1
(45) Date of Patent: Sep. 18, 2001

(54) PRECISION, LOW-POWER TRANSIMPEDANCE CIRCUIT WITH DIFFERENTIAL CURRENT SENSE INPUTS AND SINGLE ENDED VOLTAGE OUTPUT

(75) Inventor: Leonel Ernesto Enriquez, Melbourne Beach, FL (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/686,506

(22) Filed: Oct. 11, 2000

(51) Int. Cl.[7] .................................................. H03K 5/153
(52) U.S. Cl. ........................... 327/89; 327/560; 327/561; 330/258; 330/259
(58) Field of Search ............................. 327/89, 560, 561, 327/562, 563; 330/258, 259, 260, 261, 291, 292

(56) References Cited

U.S. PATENT DOCUMENTS 4,336,502 * 6/1982 Goto ...................................... 330/253
5,640,128 * 6/1997 Wilhelm ............................... 330/308
6,028,482 * 2/2000 Herrrle ................................. 330/282

* cited by examiner

*Primary Examiner*—Timothy P. Callahan
*Assistant Examiner*—An T. Luu
(74) *Attorney, Agent, or Firm*—Allen, Dyer, Doppelt Milbrath & Gilchrist, P.A.

(57) ABSTRACT

A transimpedance circuit adapted for use in a subscriber line interface circuit includes sense resistors installed in closed loop, negative feedback paths of respective sense amplifiers. Voltage drops across the sense resistors are applied to first and second differential coupling circuits for applying differential currents to complementary polarity inputs of an operational amplifier. The inputs of the amplifier are also coupled to a linearity compensator, that is configured to provide sufficient overhead voltages in the presence of worst case voltage swing conditions. The compensator has a differential amplifier configuration, that closes a negative feedback loop from the output of the amplifier and one of its inputs, relative to a reference voltage balancing path coupled to the amplifier's other (complementary) input. The balanced differential configuration forces corresponding terminals of a pair of load resistors coupled to the inputs of the operational amplifier to the same potential, irrespective of variations in the input currents.

20 Claims, 2 Drawing Sheets

PRECISION, LOW-POWER TRANSIMPEDANCE CIRCUIT WITH DIFFERENTIAL CURRENT SENSE INPUTS AND SINGLE ENDED VOLTAGE OUTPUT

FIELD OF THE INVENTION

The present invention relates in general to communication systems and components, and is particularly directed to a transimpedance circuit, that is configured to transform a pair of differentially sensed input currents into a very precise, single ended output voltage. The transimpedance circuit provides a very high degree of common mode rejection, can operate in high or low D.C. voltage and current environments, and consumes very little power. As a non-limiting example, the transimpedance circuit of the invention may be used to sense differential tip and ring currents of a subscriber line interface circuit.

BACKGROUND OF THE INVENTION

A wide variety of electronic circuit applications require the differential measurement of two (complementary) currents and some prescribed amount of rejection of their common mode components. In some applications, the currents being measured exist in a high D.C. voltage and high D.C. current environment, yet their information content is ultimately to be employed in a low voltage and low current environment, with demanding requirements for accurate amplification and filtering, plus the additional requirement for low idle channel noise. As a non-limiting example, various equipments employed by telecommunication service providers employ what are known as 'SLIC's (subscriber line interface circuits), to interface (transmit and receive) telecommunication signals with respect to tip and ring leads of a wireline pair. Since the length of the wireline pair to which a SLIC is connected can be expected to vary from installation to installation, may have a very significant length (e.g., on the order of multiple miles), and transports both substantial DC voltages, as well as AC signals (e.g., voice and/or ringing), it has been difficult to realize a SLIC implementation that has 'universal' use in both legacy and state of the art installations.

SUMMARY OF THE INVENTION

In accordance with the present invention, shortcomings of conventional transimpedance circuits, such as, but not limited to those intended for use in telecommunication service providers' wireline equipments (such as SLICs) that may be installed in a wide range of voltage and current environments, are effectively obviated by a new and improved, transimpedance circuit, that is capable of performing a very precise differential input current to single ended output voltage conversion, while enjoying a very high degree of common mode rejection, and reduced power dissipation, thereby making it particularly suited for remote site subscriber installations.

For a SLIC application, respective (tip and ring associated) current sense resistors may be installed in the closed loop, negative feedback paths of 'tip' and 'ring' path current sense amplifiers. The currents through the sense resistors may contain a desirable differential current component $I_{DIFF}$ and a common mode undesirable component $I_{COM}$. The current sense amplifiers provide substantial performance in terms of gain and gain-bandwidth product, so that any voltage dropped across the sense resistors appear as a negligibly small component of the voltage between the tip and ring terminals of the SLIC.

A voltage drop proportional to the current through each of the (tip/ring path) sense resistors is supplied as a differential control voltage to respective differential coupling circuits installed between associated bias current sources and the complementary polarity inputs of an operational amplifier, that provides the single ended output voltage. Each bias current source is coupled through an associated pair of bias resistors for the differential coupling circuits. As will be described, the maximum current that can be sensed in each complementary (tip/ring) current flow path of the transimpedance circuit is limited by the product of a maximum bias current supplied by the respective (tip and ring path) bias current sources and the ratio of a pair of transistor emitter bias resistances to the resistance value of the (tip and ring path) sense resistors.

In addition to differentially sensing the complementary (tip and ring) currents flowing through the sense resistors and their associated differential coupling circuits, the input terminals of the operational amplifier are coupled to a linearity compensator circuit, which is configured to provide sufficient overhead voltages in the presence of worst case voltage swing conditions. The linearity compensator circuit has a differential amplifier configuration, coupled to close a negative feedback loop from the single ended output and one of the inputs to the operational amplifier, relative to a reference voltage balancing path coupled to the amplifier's other (complementary) input. This balanced coupling configuration forces the corresponding terminals of a pair of load resistors coupled to the input ports of the operational amplifier to the same potential, irrespective of variations in the sensed input currents.

For this purpose, a first differential compensator portion of the linearity compensator includes a first 'overhead voltage' emitter-follower transistor having its collector-emitter path coupled in circuit with a first bias current source. This first overhead transistor has its base coupled to receive a reference voltage established by a voltage drop across a resistor coupled to receive a prescribed overhead bias current. The emitter output of the first overhead transistor provides base drive to a first emitter-follower configured compensator transistor pair, the current output of which is coupled through a first load resistor to the (+) input of the operational amplifier.

To close the negative feedback loop of the operational amplifier, a second compensator portion of the linearity compensator includes a second overhead voltage emitter-follower transistor having its collector-emitter path coupled in circuit with a second bias current source, and its base coupled through a feedback resistor to the single ended voltage output of the operational amplifier. The emitter output of the second overhead transistor provides base drive to a second emitter-follower configured compensator transistor pair, the current output of which is coupled through a second load resistor to the (−) input of the operational amplifier.

By matching the bias resistors for the differential coupling circuits and the load resistors and parameters of the complementary sides of the differentially configured coupling and compensator circuits installed between the sense resistors and the operational amplifier, the single ended output voltage $V_{OUT}$ produced at the output of the operational amplifier is effectively linearly definable in terms of the sensed current $I_{DIFF}$ and the values $R_{SENSE}$ of the sense resistors, as $V_{OUT}=2*I_{DIFF}*R_{SENSE}$. By optimizing the match between the resistance values of the sense resistors, and the match between the resistance values of the load resistors and the resistance values of the bias resistors common mode output error is minimized.

DETAILED DESCRIPTION

As described briefly above, for purposes of providing a non-limiting practical example, the transimpedance circuit of the invention will be described in terms of its use in a communication interface device, in particular, as a current-sense, voltage-feed transimpedance circuit for a subscriber line circuit or SLIC. It may be noted, however, that the invention is not limited to this application or type of signaling interface, but may be employed in a variety of signaling environments that contain or are coupled with complementary current paths. In the non-limiting SLIC-associated embodiment described here, the complementary current signal paths correspond to respective 'tip' and 'ring' paths of a wireline telecommunication circuit.

Figure 1:
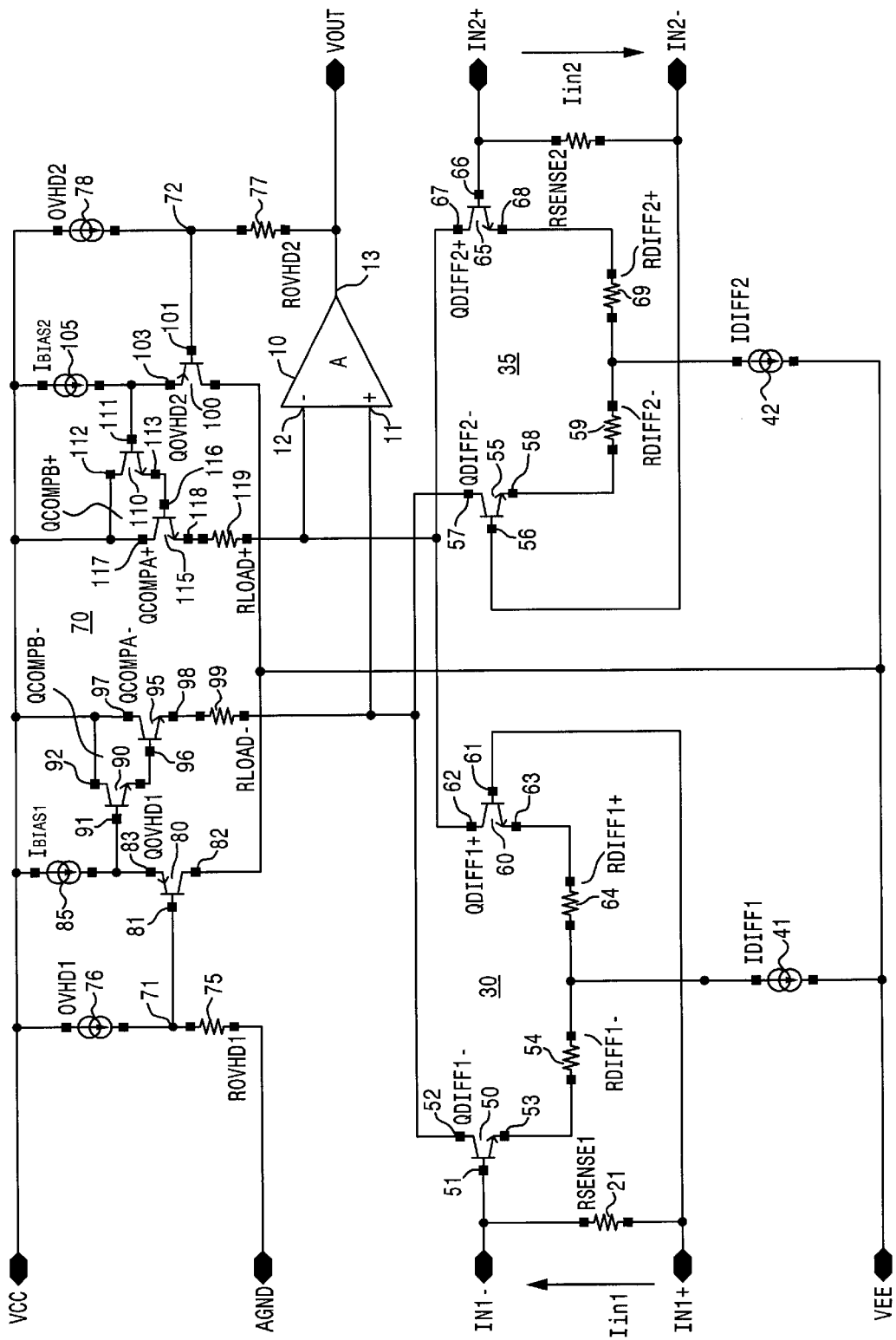
FIG. 1 diagrammatically illustrates a transimpedance circuit in accordance with a non-limiting, but preferred embodiment of the present invention.

Referring now to FIG. 1, a non-limiting, but preferred embodiment of a transimpedance circuit in accordance with the present invention is diagrammatically illustrated as comprising an operational amplifier 10, having first (+) and second (−) complementary polarity, or differential, inputs 11 and 12, and a single ended output 13. For the non-limiting application as a tip and ring current-sensing SLIC interface, the amplifier's (+) input 11 may be associated with the tip/ring path of a telecommunication signaling wireline pair, while the (−) input 12 may be associated with the wireline pair's ring/tip path.

In order to sense current flowing in one of the complementary signaling paths, a first sense resistor 21 is coupled between a pair of input nodes IN1+ and IN1− installed in the signaling path of interest, (e.g., the tip path of a telecommunication wireline pair), and current flow through which is denoted by a current Iin1. As will be described, the current Iin1 flowing through the first sense resistor 21 represents the first (here tip-associated) component of a summation of a desired differential current component ($I_{DIFF}$) that is to be transformed into an output voltage $V_{OUT}$ at the output 13 of the amplifier, plus an undesirable common mode or longitudinal current component $I_{COM}$ that is to be effectively rejected as a component in the output voltage produce at output 13.

The sense resistor 21 may comprise a relatively small valued resistor (having a resistance value denoted $R_{SENSE1}$, which may be on the order of several to several tens of ohms, for example), coupled between the output of a (tip) sense amplifier and its associated tip path output port of a low power receiver channel circuit of a subscriber line interface circuit for interfacing communication signals supplied from a device, such as a modem, with a wireline pair for delivery to a remote circuit, such as a subscriber's telephone. For this purpose, as shown in the sensing block circuit diagram of FIG. 2, the sense resistor 21 may be installed in the closed loop, negative feedback path of a 'tip' path sense amplifier 23, which has its (−) input coupled through an input resistor 24 to the IN1− node and its output coupled to the IN1+ node.

The current Iin1 through the (tip) current sense resistor 21 provides a voltage drop proportional to the tip path current, and which is supplied as a differential control voltage to a first (tip path) differential coupling circuit 30, that is coupled between a first current source 41 (which is shown reference to a power supply rail VEE) and the complementary polarity inputs 10 11, 12 of the operational amplifier 10. In a non-limiting configuration, the differential coupling circuit 30 may comprise a differentially coupled pair of (NPN) bipolar transistors 50 and 60. Although bipolar components are shown, it is to be understood that the invention is not limited thereto, but also may be implemented using alternative equivalent circuit devices, such as field effect transistors (FETs), for example.

The current source 41 and an associated pair of bias resistors 54 and 64 for the first (tip path-associated) differential coupling circuit 30, plus like components of a second (ring path-associated) differential coupling circuit 35, establish the dynamic range of the transimpedance circuit. As will be described, the maximum current that can be sensed in each complementary (tip/ring) current flow path of the transimpedance circuit is limited by the product of the maximum bias current $I_{DIFF}$ supplied by the respective (tip and ring path) current sources 41 and 42 and the ratio of the value of one of the emitter bias resistances $R_{DIFF}$ to the resistance value $R_{SENSE}$ of the (tip and ring path) sense resistors 21 and 22.

Since the current supplied by the current source 41 is based upon the dynamic range needs of the transimpedance circuit, and as these requirements will vary depending upon the mode of operation of the SLIC, by configuring the current source 41 as a controllable device, power consumption can be minimized. For example, during the on-hook, quiescent mode (no circuit operation) of a subscriber's telephone, there is no need to draw any current; consequently during this mode, the output of the current source 41 can be reduced to zero, so that no power is consumed. For on-hook reduced power signal monitoring, such as for the case of a phone having caller-ID class of service, only a very reduced or minimal current is necessary, so that power consumption can be kept relatively small. It is not until the phone is placed in its off-hook voice signaling mode that the full dynamic range properties of the SLIC are required; in this mode the current output of the current source 41 would be controllably increased to its maximum value.

Transistor 50 of the (tip side) differential coupling circuit 30 has its control terminal or base 51 coupled to the input node IN1−, and its collector 52 coupled to supply a first output voltage $V_{DIFF1-}$ to the resistor 99 (having a value denoted $R_{LOAD-}$) coupled to the (+) input 11 of the operational amplifier 10. The emitter bias and thereby the operation of transistor 50 is established by coupling the emitter 53 of transistor 50 through a bias resistor 54 (having a value denoted $R_{DIFF1-}$) to the first current source 41, which supplies a first reference current $I_{DIFF1}$. As pointed out above, by configuring the current source 41 as a controllable device, the circuit's power consumption can be minimized.

In like manner, the other transistor 60 of the differentially coupled pair 50/60 has its control terminal/base 61 coupled to the input node IN1+, and its collector 62 coupled to supply a second output voltage $V_{DIFF1+}$ to the resistor 119 (having a value denoted ($R_{LOAD+}$) coupled to the (−) input 12 of operational amplifier 10. Like transistor 50, the operation of transistor 60 is established by coupling its emitter 63 through bias resistor 64 (having a value denoted $R_{DIFF1+}$) to the first current source 41.

Figure 2:
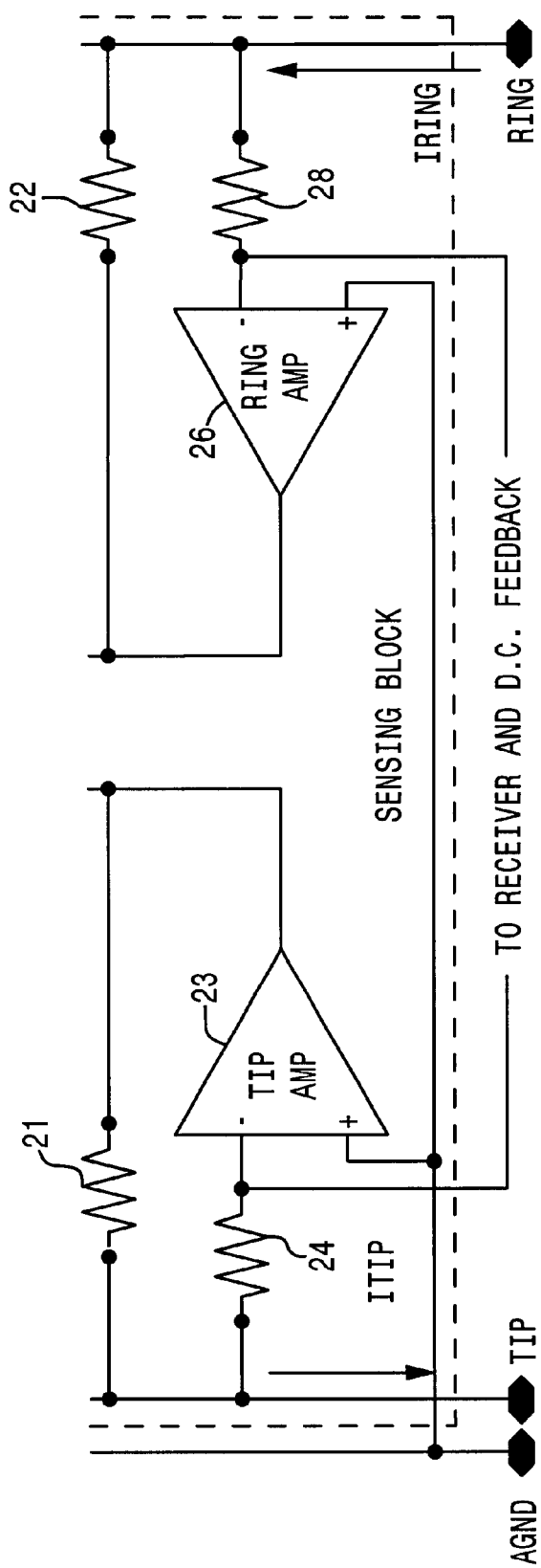
FIG. 2 shows tip and ring path sense amplifiers containing sense resistors for the transimpedance circuit of FIG. 1.

For the complementary signaling (ring) path, a second 'ring' sense resistor 22 is coupled between input nodes IN2+ and IN2− of a second or ring current sense path Iin2. Like the tip path sense resistor 21, the ring path sense resistor 22 comprises a relatively small valued resistor (having a resistance value denoted $R_{SENSE2}$), which is very closely matched (within a small fraction of one percent) with the tip sense resistor 21 for the purpose of providing the desired degree of common mode rejection (longitudinal balance) required of a SLIC. As shown in FIG. 2, the ring path sense resistor 22 installed in the closed loop negative feedback path of a 'ring' side sense amplifier 26, which has its (−) input coupled through an input resistor 28 to the IN2− node and its output coupled to the IN2+ node.

Both the tip path sense amplifier 23 and the path ring sense amplifier 26 provide substantial performance in terms of gain and gain-bandwidth product. Therefore, with sense resistors 21 and 22 installed in closed loop paths of their associated tip and ring sense amplifiers 24 and 26, any voltages dropped across these resistors will appear as a negligibly small component of the voltage between the tip and ring terminals of the SLIC.

The voltage drop across the (ring) current sense resistor 22 resulting from the current Iin2 flowing therethrough is applied as a differential control voltage to a second differential coupling circuit 35, which is connected in circuit between the second current source 42 and the complementary polarity inputs 11, 12 of the operational amplifier 10. As shown in FIG. 1, the direction of current flow of current Iin2 is assumed to be opposite to that of current Iin1. These currents contain a desirable differential current component $I_{DIFF}$ and an undesirable common mode current component $I_{COM}$ to be rejected.

Like the first differential coupling circuit 30, the second differential coupling circuit 35 may comprise a differentially coupled bipolar transistor pair of NPN transistors 55 and 65. Transistor 55 has its base 56 coupled to the input node IN2−, and its collector 57 coupled to supply an output voltage $V_{DIFF2-}$ to the ($R_{LOAD-}$) resistor 119 coupled to the (+) input 11 of the operational amplifier 10. Emitter bias for transistor 55 is provided by coupling the emitter 58 through a bias resistor 59 (having a value denoted $R_{DIFF2-}$) to the second current source 42, also referenced to the voltage supply rail VEE, and supplying a second reference current $I_{DIFF2}$. In a like manner, transistor 65 has its control terminal/base 66 coupled to the input node IN2+, and its collector 67 coupled to supply an output voltage $V_{DIFF2+}$ to the ($R_{LOAD+}$) resistor 99 coupled the (−) input 12 of the operational amplifier 10. The operation of the transistor 65 is established by biasing its emitter 68 through bias resistor 69 (having a value denoted $R_{DIFF2+}$) to the second current source 42.

In addition to differentially sensing the complementary (tip and ring) currents Iin1 and Iin2 flowing through the complementary current paths' sensing resistors 21 and 22 and their associated differential coupling circuits 30 and 35, the input terminals 11 and 12 of the operational amplifier 10 are further coupled to a differentially configured, linearity compensator circuit 70, which is coupled in circuit with voltage supply rails VEE and VCC, and is operative to provide sufficient overhead voltages in the presence of worst case voltage swing conditions.

The linearity compensator circuit 70 has a differential amplifier configuration, which is coupled to close a negative feedback loop from output 13 to the inverting (−) input 12 of the operational amplifier 10, relative to reference voltage balancing path coupled to the amplifier's non-inverting (+) input 11. As will be described, this balanced coupling configuration forces the bottom terminals of a pair of load resistors 99 and 119 of the linearity compensator circuit 70, that are coupled to the input ports 11 and 12 of the operational amplifier 10, to the same potential, irrespective of variations in the sensed input currents.

For this purpose, a first (+) differential compensator portion of the linearity compensator 70 comprises a first (PNP) emitter-follower 'overhead' transistor 80 having its collector-emitter path coupled in circuit with a first bias current source 85 (referenced to the VCC voltage supply rail) and the supply rail VEE. The first bias current source 85 generates a bias current $I_{BIAS1}$. The first overhead transistor 80 has its control node or base 81 coupled to a reference voltage node 71. The voltage at the reference voltage node 71 is established by a voltage drop across a resistor 75 (having a resistance value $R_{OVHD1}$) relative to a voltage node, such as ground (AGND), as a result of a prescribed overhead current $I_{OVDH1}$ therethrough as supplied by a current course 76, referenced to the VCC supply rail.

The emitter 83 of the first overhead transistor 80 is coupled to the base 91 of an emitter-follower NPN transistor 90 of an emitter-follower configured compensator (COMP−) transistor pair 90/95. The collector 92 of transistor 90 and the collector 97 of transistor 95 are coupled to the VCC supply rail. The emitter 98 of transistor 95 is coupled through the load resistor 99 to the (+) input 11 of the operational amplifier 10. Each of the respective values of load resistors 99 and 119 (denoted $R_{LOAD-}$ and $R_{LOAD+}$) is the same and may be denoted as $R_{LOAD}$.

To close the negative feedback loop of the operational amplifier 10, a second (−) differential compensator portion of the linearity compensator 70 includes a second (PNP) emitter-follower 'overhead' transistor 100 having its base 101 coupled to a feedback voltage node 72. Node 72 is coupled through a feedback resistor 77 (having a resistance value $R_{OVHD2}$) to the output node 13 of the operational amplifier 10. A reference current course 78 is coupled to supply an overhead current $I_{OVDH2}$ to the node 72 and thereby to the feedback resistor 77. Overhead transistor 100 has its emitter-collector current path coupled in circuit with bias current source 105, referenced to the VCC voltage supply rail, and the supply rail VEE, and being operative to generate a second bias current $I_{BIAS2}$.

The second overhead transistor 100 has its emitter 103 coupled to the base 111 of an emitter-follower NPN transistor 110 of an emitter-follower configured compensator (COMP+) transistor pair 110/115. The emitter 113 of transistor 115 is coupled to the base 116 of transistor 110. The collector 112 of transistor 110 and the collector 117 of transistor 115 are coupled to the VCC supply rail. The emitter 118 of emitter-follower transistor 115 is coupled through load resistor 119 to the (−) input 12 of operational amplifier 10.

The transimpedance circuit of FIG. 1 operates as follows. As pointed out above, the complementary currents Iin1 and Iin2 that are assumed to be flowing in the directions shown through the respective first (tip) and second (ring) sense resistors 21 and 22 may be defined in equations (1) and (2) as:

$$Iin1 = I_{DIFF} + I_{COM} \quad (1).$$

$$Iin2 = I_{DIFF} - I_{COM} \quad (2).$$

With linearity compensator 70 coupled in differential configuration between nodes 71 and 72, a differential overhead voltage $\Delta V_{OVHDem}$ representative of the difference between the emitter voltages of the emitter-follower transistors 80 and 100 will be applied to the bases 91/111 of COMP transistors 90/110. With the base-emitter voltage being denoted as Vbe, this differential overhead voltage may be defined in equation (3) as:

$$\Delta V_{OHDem} = Vbe_{110(COMP+)} + Vbe_{115(COMP+)} + I_{RLOAD119} * R_{LOAD199} - I_{RLOAD99} * R_{LOAD99} - Vbe_{90(COMP-)} - Vbe_{95(COMP-)} \quad (3).$$

However, a load current $I_{RLOAD-}$ through the load resistor 99 of the (+) leg of linearity compensator 70 effectively corresponds to the sum of the differential currents $I_{RDIFF1-}$ and $I_{RDIFF2-}$ through bias resistors 59 and 54, respectively. Namely, $$I_{LOAD99} = I_{RLOAD-} = \alpha_N(I_{RDIFF1-} + I_{RDIFF2-}) \quad (4),$$

(where $\alpha_N$ is a proportionality constant which, for practical purposes is equal to 1.0 and therefore, will not be delineated in subsequent expressions).

Similarly, a load current $I_{RLOAD+}$ through the (−) compensator leg load resistor 119 effectively corresponds to the sum of the differential currents $I_{RDIFF1+}$ and $I_{RDIFF2+}$ through the bias resistors 69 and 64, respectively. Namely, $$I_{LOAD119} = I_{RLOAD+} = I_{RDIFF1+} + I_{RDIFF2+} \quad (5).$$

In addition, the voltage $V_{SENSE1}$ across the first (tip) sense resistor 21 may be expressed as:

$$V_{SENSE1} = Iin1 * R_{SENSE1} = Vbe_{60(DIFF1+)} + (I_{RDIFF1+}) * (R_{DIFF1+}) - (I_{RDIFF1-}) * (R_{DIFF1-}) - Vbe_{50(DIFF1-)} \quad (6).$$

The voltage $V_{SENSE2}$ across the second (ring) sense resistor 22 may be expressed as:

$$V_{SENSE2} = Iin2 * R_{SENSE2} = Vbe_{65(DIFF2+)} + (I_{RDIFF2+}) * (R_{DIFF2+}) - (I_{RDIFF2-}) * (R_{DIFF2-}) - Vbe_{55(DIFF2-)} \quad (7).$$

Substituting equations (4) and (5) into equation (3) yields:

$$\Delta V_{OVHDem} = (I_{RDIFF1+} + I_{RDIFF2+}) * (R_{LOAD119}) - (I_{RDIFF1-} + I_{RDIFF2-}) * (R_{LOAD99}) - Vbe_{90(COMP-)} Vbe_{110(COMP+)} - Vbe_{95(COMP-)} + Vbe_{115(COMP+)} \quad (8)$$

Adding equations (6) and (7) yields:

$$Iin1 * R_{SENSE1} + Iin2 * R_{SENSE} = (I_{RDIFF1+}) * (R_{DIFF1+}) + (I_{RDIFF2+}) * (R_{DIFF2+}) - (I_{RDIFF1-}) * (R_{DIFF1-}) - (I_{RDIFF2-}) * (R_{DIFF2-}) - Vbe_{55(DIFF2-)} - Vbe_{50(DIFF1-)} + Vbe_{65(DIFF2+)} + Vbe_{60(DIFF1+)} \quad (9).$$

Subtracting equation (9) from equation (8) yields:

$$\Delta V_{OVHDem} - (Iin1 * R_{SENSE1} + Iin2 * R_{SENSE2}) = (I_{RDIFF1+}) * (R_{LOAD+} - R_{DIFF1-}) + (I_{RDIFF2+}) * (R_{LOAD+} - R_{DIFF2-}) - (I_{RDIFF1-}) * (R_{LOAD-} - R_{DIFF1+}) + (I_{RDIFF2-}) * (R_{LOAD-} - R_{DIFF2+}) + [(Vbe_{110(COMP+)} - Vbe_{90(COMP-)}) + (Vbe_{55(DIFF2-)} + Vbe_{50(DIFF1-)})] + [(Vbe_{115(COMP+)} - Vbe_{95(COMP-)}) - ((Vbe_{65(DIFF2+)} + Vbe_{60(DIFF1+)})] \quad (10).$$

This relationship may be alternatively expressed as:

$$\Delta V_{OHDem} - (Iin1 * R_{SENSE1} + Iin2 * R_{SENSE2}) = (I_{RDIFF1+}) * (R_{LOAD+} - R_{DIFF1-}) + (I_{RDIFF2+}) * (R_{LOAD+} - R_{DIFF2-}) - (I_{RDIFF1-}) * (R_{LOAD-} - R_{DIFF1+}) - (I_{RDIFF2-}) * (R_{LOAD-} - R_{DIFF2+}) + (kT/q) * \ln[\{(I_{RDIFF1+} + I_{RDIFF2+})/(I_{RDIFF1-} - I_{RDIFF2-})\}^2 * (I_{RDIFF1-}/I_{RDIFF1+}) * (I_{RDIFF2-}/I_{RDIFF2+})] \quad (11),$$

(where k is Boltzman's constant, T is absolute temperature, and q is the electron charge).

Assuming that all emitter areas of the transistors are identical, and that the betas of transistors 95 and 115 are well matched, the logarithmic portion of equation (11) may be rewritten in expression (12) as:

$$(kT/q) * \ln[\{(I_{RDIFF1+} + I_{RDIFF2+})/(I_{RDIFF1+})\} * \{(I_{RDIFF1+} + I_{RDIFF2+})/(I_{RDIFF2+})\} * \{(I_{RDIFF1-})/(I_{RDIFF1-} + I_{RDIFF2-})\} * \{(I_{RDIFF2-})/(I_{RDIFF1-} + I_{RDIFF2-})\}], \quad (12)$$

or in expression (13) as:

$$(kT/q) * \ln[\{1 + \Delta I_{21+}/I_{RDIFF1+}) + (\frac{1}{4}) * (\Delta I_{21+}/I_{RDIFF1+})^2 \} * \{1 + \Delta I_{21-}/I_{RDIFF1-}\} * \{1 + \Delta I_{21-}/I_{RDIFF1-}\} + (\frac{1}{4}) * (\Delta I_{21-}/I_{RDIFF1-})^2 \}^{-1} * \{1 + \Delta I_{21+}/I_{RDIFF1+}\}^{-1}], \quad (13)$$

where $$I_{DIFF2+} = I_{DIFF1+} + \Delta I_{21+},$$

and $$I_{DIFF2-} = I_{DIFF1-} + \Delta I_{21-}.$$

For any practical conditions encountered in real applications, both quadratic terms found in equation (13) are negligible. This reduces expression (13) to:

$$(kT/q) * \ln[\{1 + \Delta I_{21+}/I_{RDIFF1+}\} * \{1 + \Delta I_{21-}/I_{RDIFF1-}\} * \{1 + \Delta I_{21-}/I_{RDIFF1-}\}^{-1} * \{1 + \Delta I_{21+}/I_{RDIFF1+}\}^{-1}] \quad (14)$$

which yields $$(kT/q) * \ln[1] = 0. \quad (15)$$

By matching the bias resistors so that $R_{DIFF1+} = R_{DIFF1-} = R_{DIFF2+} = R_{DIFF2-} = R_{LOAD}$, and substituting in equation (11) yields:

$$\Delta V_{OHDem} = Iin1 * R_{SENSE1} + Iin2 * R_{SENSE2} \quad (16).$$

If $R_{SENSE1} = R_{SENSE1} = R_{SENSE}$ \quad (17), then $$\Delta V_{OHDem} = (Iin1 + Iin2) * R_{SENSE} \quad (18).$$

Substitution of equations (1) and (2) into equation (18) yields:

$$\Delta V_{OHDem} = 2 * I_{DIFF} * R_{SENSE} \quad (19),$$

which lacks any contribution from the undesirable longitudinal components of equations (1) and (2).

An examination of FIG. 1 reveals that the voltage $V_{OUT}$ at the output terminal 13 may be defined as:

$$V_{OUT} = I_{OVHD1} * (R75 = R_{OVHD1}) + Vbe_{80(OVHD1)} + \Delta V_{OHDem} - Vbe_{100(VOHD2)} - I_{OVHD2} * (R77 = R_{OVHD2}) \quad (20).$$

Again by matching circuit parameters, in particular, by making $R_{75} = R_{77}$; $I_{OVHD1} = I_{OVHD2}$; $I_{BIAS1} = I_{BIAS2}$; and using equal geometries for the overhead transistors 80 and 100 (which is readily accomplished by placing these transistors immediately adjacent to each other using present day semiconductor processing), equation (20) reduces to:

$$V_{OUT} = \Delta V_{OHDem} \quad (21).$$

Namely, the output voltage $V_{OUT}$ produced at the output terminal 13 of the operational amplifier 10 is relatively simply and linearly definable in terms of the sensed current $I_{DIFF}$ and the values of the sense resistors $R_{SENSE}$. In particular, $$V_{OUT} = 2 * I_{DIFF} * R_{SENSE} \quad (22).$$

It may be noted that reversing the direction of the input currents Iin1 and Iin2 being sensed simply reverses the polarity of the output voltage VOUT supplied at output terminal 13.

Equation (22) implies that if either of the two sensed currents Iin1 or Iin2 is flowing in a direction opposite to that shown in FIG. 1 and both currents have the same value, the resulting voltage $V_{OUT}$ in equation (22) approaches zero. Namely, by optimizing the match between the resistance value $R_{SENSE}$ of the sense resistors 21 and 22, and the match between the resistance values $R_{DIFF}$ of the bias resistors 54, 59, 64, 69, common mode output error is minimized.

While I have shown and described an embodiment in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed is:

1. A transimpedance circuit comprising:
   an operational amplifier having first and second complementary polarity inputs and an output;
   a first sense resistor coupled in a first current sense path;
   a first differential coupling circuit coupled between said first sense resistor and said first and second complementary polarity inputs of said operational amplifier, and being operative to apply a first differential input current to said first and second complementary polarity inputs of said operational amplifier in accordance with a first voltage across said first sense resistor;
   a second sense resistor coupled in a second current sense path;
   a second differential coupling circuit coupled between said second sense resistor and said first and second complementary polarity inputs of said operational amplifier, and being operative to apply a second differential input current to said first and second complementary polarity inputs of said operational amplifier in accordance with a second voltage across said second sense resistor; and
   a compensator circuit coupled between a supply voltage node and said first and second complementary polarity inputs of said operational amplifier, and being operative to close a negative feedback path from said output of said operational amplifier to said first input of said operational amplifier, relative to a voltage balancing path coupled to said second input of said operational amplifier, and equalize voltages applied thereby to said first and second complementary polarity inputs of said operational amplifier, irrespective of variations in currents through said first and sense resistors.

2. A transimpedance circuit according to claim 1, wherein said first and second current sense paths are adapted to be coupled with respective tip and ring paths of a telecommunication circuit.

3. A transimpedance circuit according to claim 1, wherein said first and second differential coupling circuits are respectively coupled to provide said first and second differential input currents in accordance with said first and second voltages respectively across said first and second sense resistors relative to first and second bias voltages.

4. A transimpedance circuit according to claim 1, wherein said first and second reference current sources are configured to supply variable reference currents.

5. A transimpedance circuit according to claim 1, wherein said first and second differential coupling circuits comprise respective first and second pairs of differentially coupled transistor circuits, respective control electrodes of which are coupled to receive said first and second voltages across said first and second sense resistors, output electrodes of which are coupled to said first and second complementary polarity inputs of said operational amplifier, and being respectively coupled through operation-controlling bias resistors to first and second bias current sources.

6. A transimpedance circuit according to claim 5, wherein said operation-controlling bias resistors of said differential coupling circuits are closely matched.

7. A transimpedance circuit according to claim 1, wherein said compensator circuit comprises a differentially configured compensator having a first compensator path coupled in circuit with a first supply voltage, and being operative to supply a reference current through a first load resistor to said first input of said operational amplifier, and a second compensator path coupled in circuit with said first supply voltage, and being operative to supply a feedback path current through a second load resistor to said second input of said operational amplifier, in accordance with an output voltage of said operational amplifier.

8. A transimpedance circuit according to claim 7, wherein said first and second differential coupling circuits comprise respective first and second pairs of differentially coupled transistor circuits, respectively coupled through operation-controlling bias resistors to first and second bias current sources therefor, control electrodes of which are respectively coupled to receive said first and second voltages across said first and second sense resistors, and output electrodes of which are coupled to said first and second complementary polarity inputs of said operational amplifier.

9. A transimpedance circuit according to claim 8, wherein said operation-controlling bias resistors for said differential coupling circuits are matched with said first and second load resistors of said first and second compensator paths.

10. A transimpedance circuit according to claim 9, wherein circuit component parameters of differential portions of said differentially configured compensator and said first and second differential coupling circuits are matched, such that a single ended output voltage produced at said output of said operational amplifier is effectively linearly definable in terms of a desired differential current through said sense resistors and values of said sense resistors.

11. A transimpedance circuit for converting a differential input current through first and second current paths into a single ended output voltage, while rejecting common mode currents through said first and second current paths comprising:
   a first current sensing element coupled with said first current path;
   a second current sensing element coupled with said second current path;
   an operational amplifier having first and second complementary polarity inputs and an output from which said single ended output voltage is derived;
   a first differential coupling circuit operative to couple a first differential input current to said first and second complementary polarity inputs of said operational amplifier in proportion to a first current flowing through said first current path;
   a second differential coupling circuit operative to couple a second differential input current to said first and second complementary polarity inputs of said operational amplifier in proportion to a second current flowing through said second current path; and
   a compensator circuit coupled between a supply voltage node and said first and second complementary polarity inputs of said operational amplifier, and being operative to equalize voltages applied to said first and second complementary polarity inputs of said operational amplifier, in accordance with a prescribed relationship between said single ended output voltage and a reference voltage.

12. A transimpedance circuit according to claim 11, wherein circuit component parameters of differential portions of said compensator circuit and said first and second differential coupling circuits are matched, such that said single ended output voltage produced at said output of said operational amplifier is effectively linearly definable in terms of values of said current sensing elements resistors and a desired differential current through said first and second current paths exclusive of common mode currents therethrough.

13. A transimpedance circuit according to claim 11, wherein said first and second current sense elements comprise tip and ring sense resistors adapted to be coupled with respective tip and ring paths of a telecommunication circuit.

14. A transimpedance circuit according to claim 11, wherein said first and second differential coupling circuits are configured to couple said first and second differential input currents to said first and second complementary polarity inputs of said operational amplifier in accordance with first and second voltages across said first and second sense elements relative to first and second bias voltages.

15. A transimpedance circuit according to claim 11, wherein said first and second differential coupling circuits comprise respective first and second pairs of differentially coupled transistor circuits, control electrodes of which are coupled to receive first and second voltages across said first and second sense elements, output electrodes of which are coupled to supply differential currents to said first and second complementary polarity inputs of said operational amplifier, and being respectively coupled through operation-controlling bias resistors to first and second bias current sources.

16. A transimpedance circuit according to claim 11, wherein said compensator circuit comprises a differentially configured compensator having a first compensator path coupled in circuit with a first supply voltage, and being operative to supply a reference current through a first load resistor to said first input of said operational amplifier, and a second compensator path coupled in circuit with said first supply voltage, and being operative to supply a feedback path current through a second load resistor to said second input of said operational amplifier, in accordance with said single ended output voltage of said operational amplifier.

17. A transimpedance circuit according to claim 16, wherein said operation-controlling bias resistors for said differential coupling circuits are matched with said first and second load resistors of said first and second compensator paths, and wherein resistance values of first and second current sensing elements are well matched with each other.

18. A method for converting a differential input current flowing through first and second current paths into a single ended output voltage, while rejecting common mode currents through said first and second current paths comprising:

(a) coupling first and second current sensing elements with said first and second current paths, respectively;

(b) coupling a first differential input current to first and second complementary polarity inputs of an operational amplifier in proportion to a first current flowing through said first current path, and coupling a second differential input current to said first and second complementary polarity inputs of said operational amplifier in proportion to a second current flowing through said second current path; and (c) equalizing first and second equalized voltages coupled to said first and second complementary polarity inputs of said operational amplifier, in accordance with a prescribed relationship between a single ended output voltage derived from an output of said operational amplifier and a reference voltage.

19. A method according to claim 18, wherein step (c) comprises installing a differentially configured compensator circuit between a voltage supply terminal and first and second load resistors, respectively coupled to said first and second inputs of said operational amplifier, said differentially configured compensator circuit having a first compensator path coupled in circuit with said voltage supply terminal, and being operative to supply a reference current through said first load resistor to said first input of said operational amplifier, and a second compensator path coupled in circuit with said voltage supply terminal and being operative to supply a feedback path current through said second load resistor to said second input of said operational amplifier, in accordance with said single ended output voltage of said operational amplifier.

20. A method according to claim 18, wherein said first and second current sense elements comprise tip and ring sense resistors adapted to be coupled with respective tip and ring paths of a telecommunication circuit.

* * * * *